United States Patent
Kwon et al.

(10) Patent No.: US 9,629,248 B2
(45) Date of Patent: Apr. 18, 2017

(54) EMBEDDED PRINTED CIRCUIT BOARD

(71) Applicant: LG INNOTEK CO., LTD., Seoul (KR)

(72) Inventors: Deok Soon Kwon, Seoul (KR); Sang Hyuck Nam, Seoul (KR); Won Suk Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 134 days.

(21) Appl. No.: 14/613,854

(22) Filed: Feb. 4, 2015

(65) Prior Publication Data
US 2015/0223342 A1 Aug. 6, 2015

(30) Foreign Application Priority Data
Feb. 5, 2014 (KR) .................. 10-2014-0013223

(51) Int. Cl.
| | |
|---|---|
| *H05K 1/18* | (2006.01) |
| *H05K 1/02* | (2006.01) |
| *H05K 3/00* | (2006.01) |
| *H05K 3/46* | (2006.01) |
| *H05K 3/02* | (2006.01) |
| *H05K 3/28* | (2006.01) |
| *H01L 21/56* | (2006.01) |
| *H01L 23/00* | (2006.01) |
| *H01L 27/146* | (2006.01) |

(52) U.S. Cl.
CPC ........... *H05K 1/184* (2013.01); *H05K 1/0268* (2013.01); *H05K 1/188* (2013.01); *H05K 3/4626* (2013.01); *H05K 3/4697* (2013.01); *H01L 21/568* (2013.01); *H01L 24/19* (2013.01); *H01L 24/20* (2013.01); *H01L 27/14618* (2013.01); *H01L 2224/04105* (2013.01); *H05K 3/0035* (2013.01); *H05K 3/0047* (2013.01); *H05K 3/025* (2013.01); *H05K 3/282* (2013.01); *H05K 2201/068* (2013.01); *H05K 2201/0919* (2013.01); *H05K 2201/10151* (2013.01); *H05K 2203/063* (2013.01); *H05K 2203/1383* (2013.01); *H05K 2203/1388* (2013.01); *H05K 2203/1469* (2013.01); *H05K 2203/162* (2013.01)

(58) Field of Classification Search
CPC ...... H05K 1/184; H05K 1/0268; H05K 1/188; H05K 3/4626; H05K 3/4697; H05K 21/568; H05K 3/0035; H05K 3/0047; H05K 3/025
USPC ........................................... 361/761
See application file for complete search history.

(56) References Cited

U.S. PATENT DOCUMENTS

| | | | |
|---|---|---|---|
| 8,440,544 B2* | 5/2013 | Andry | H01L 21/2007 257/E21.122 |
| 2007/0178279 A1* | 8/2007 | Ogawa | H01L 23/5389 428/137 |

(Continued)

*Primary Examiner* — Eric Thomas
*Assistant Examiner* — Michael P McFadden
(74) *Attorney, Agent, or Firm* — Ked & Associates, LLP (57) ABSTRACT

Provided is an embedded printed circuit board, including: a first insulating substrate including a first cavity and a second cavity; a first element disposed in the first cavity; an adhesive layer for adhering the first insulating substrate to the first element and including an opening to which the first element is exposed; and an second insulating substrate forming a bonding layer of a lower surface of the first insulating substrate and a bottom surface of the second cavity.

19 Claims, 5 Drawing Sheets

(56) References Cited

U.S. PATENT DOCUMENTS

| | | | |
|---|---|---|---|
| 2012/0075818 A1* | 3/2012 | Lee | H01L 24/24 361/761 |
| 2013/0050228 A1* | 2/2013 | Petersen | H01L 23/053 345/501 |

* cited by examiner

EMBEDDED PRINTED CIRCUIT BOARD

CROSS-REFERENCE TO RELATED APPLICATION

This application claims priority under 35 U.S.C. §119 to Korean Application No. 10-2014-0013223 filed on Feb. 5, 2014, in the Korean Intellectual Property Office, whose entire disclosure is incorporated herein by reference.

BACKGROUND OF THE INVENTION

1. Field

Embodiments of the present application relate to an embedded printed circuit board.

2. Background

According to an increase in various functions of a portable terminal, various sensor elements have been added to the portable terminal.

However, when sensor element is mounted to a printed circuit board (PCB) included in the portable terminal, it is difficult to add a new sensor element to the portable terminal due to a limited area of the printed circuit board.

Meanwhile, the printed circuit board (PCB) results from printing a printing circuit on an electrical insulating substrate with a conductive material, and in order to densely mount many kinds of elements on a flat board, the printed circuit board is configured such that a mounting position of each element is determined, and a circuit line connecting the elements is printed and fixed on a surface of the flat board.

A conventional embedded printed circuit board is configured such that a cavity is formed in an insulating substrate, and elements are mounted in the cavity.

However, when the conventional embedded printed circuit board has a defect, it is problematic in that the embedded high-priced elements should be also discarded with the embedded printed circuit board.

BRIEF DESCRIPTION OF THE DRAWINGS

The embodiments will be described in detail with reference to the following drawings in which like reference numerals refer to like elements wherein.

DETAILED DESCRIPTION

Hereinafter, the embodiments of the present application that an ordinary person skilled in the art can implement will be described with reference to the accompanying drawings. The embodiments in the specification and the constructions shown in the drawings are provided as a preferred embodiment of the present application, and it should be understood that there may be various equivalents and modifications which could substitute at the time of filing. In addition, when it comes to the operation principle of the preferred embodiments of the present application, when the known functions or functions are seemed to make unclear the subject matters of the present application, they will be omitted from the descriptions of the invention. The terms below are defined in consideration of the functions of the present application, and the meaning of each term should be interpreted by judging the whole parts of the present specification, and the elements having the similar functions and operations of the drawings are given the same reference numerals. As used herein, the singular forms are intended to include the plural forms as well, unless the context clearly indicates otherwise.

FIGS. 1 to 11 are views illustrated for explaining an embedded printed circuit board and a method of manufacturing the embedded printed circuit board according to one embodiment of the present application.

Figure 11:
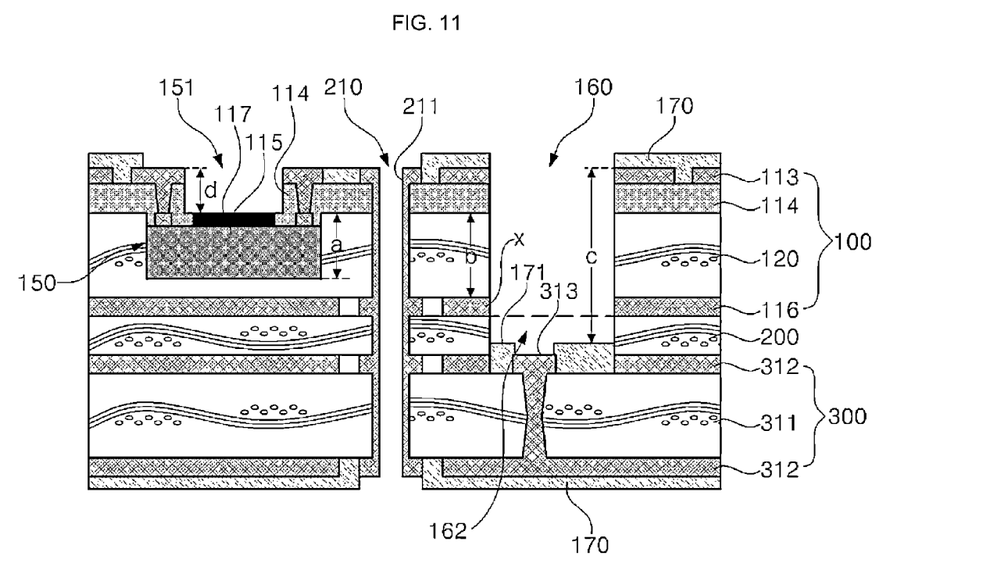

FIG. 11 is a cross-sectional concept view illustrating the structure of an embedded printed circuit board according to the present embodiment of the invention.

Referring to FIG. 11, an embedded printed circuit board according to the present embodiment of the invention may include: a first insulating substrate 100 including a first cavity 150 in which a first element 115 is mounted; a second cavity 160 separated from the first cavity 150 and formed to pass through the first insulating substrate 100; and a second insulating substrate 300 forming a bottom surface of the second cavity. In particular, the second cavity 160 is implemented in a structure in which a top surface is open and the bottom surface is supported by the second insulating substrate. Whether or not the printed circuit board is satisfactory is confirmed through such a structure, and thereafter, with regard to merely an embedded printed circuit board corresponding to a tested acceptable product, high-priced elements may be mounted in the second cavity so that a production yield rate can be improved and a production cost can be reduced. In particular, in the present embodiment of the invention, the embedded printed circuit board has a structure in which at least one conductive layer x is exposed to an internal side wall of the second cavity 160. It is advantageous in that this structure may increase the transmission efficiency of electrical signals necessary for mounting of the elements later and may remove noise resulting from unnecessary electrical signals.

As illustrated in FIG. 11, the second cavity 160 is implemented such that the top surface of the second cavity facing the bottom surface is open and the second cavity has a larger depth than a depth of the first cavity 150. In particular, the first cavity 150 is implemented to have a depth (a) that is less than a thickness (b) of the first insulating substrate. A thickness of the first element 115 mounted in the first cavity may be also implemented to be less than the thickness of the first insulating substrate. This structure may be implemented so that a basic sensing element can be stably embedded in the first cavity. Also, the first element 115 may be a sensing element having a sensing part 117. The sensing part 117 may be implemented to be exposed to the outside as illustrated in FIG. 11. Moreover, the embedded printed circuit board according to the present embodiment of the invention may further include an adhesive layer 114 on the first insulating substrate, wherein the bonding layer covers a part of the first cavity and a part of an upper portion of the first element. The adhesive layer 114 enables a gas staying space part having a fixed height and thickness (d) to be implemented around an area to which the sensing part 117 is exposed so that sensing efficiency can be increased.

The second cavity 160 has a larger depth (c) than the depth (a) of the first cavity 150. As illustrated in FIG. 11, the second cavity 160 may be implemented to entirely pass through the first insulating substrate 100 and to pass through a bonding layer 200 of an upper portion. A conductive pattern 313 exposed to the bottom surface of the second cavity may be further included, and thereafter, an electrical element may be mounted to the conductive pattern. Moreover, a protective layer 171 for protecting the mounted electrical element and the conductive pattern may be provided on the bottom surface of the second cavity 160.

The bonding layer 200 is disposed between the first insulating substrate and the second insulating substrate so as to bond the first insulating substrate to the second insulating substrate. In such a case, the second cavity may be implemented to pass through the bonding layer. In particular, the bonding layer 200 may be made of a material having substantially the same thermal expansion coefficient as that of the first insulating substrate 100. This is intended to minimize distortion between the bonded layers caused by thermal expansion later. The term 'substantially identical' explained herein means an error in thicknesses caused by a production process or a fine pollution source, namely, an error in thicknesses in a range of about 0.01%, despite the fact that the thicknesses of elements are identical to each other.

Moreover, the embedded printed circuit board according to the present embodiment of the invention may further include a through hole 210 and a conductive circuit 211, wherein the through hole passes through the first insulating substrate and the second insulating substrate. Also, a protective layer 170 is further included on an external surface of the second insulating substrate 300 and the first insulating substrate 100 so that a circuit can be protected. In this case, the protective layer 170 of the bottom surface of the second cavity and the protective layer 170 of the external surface of the second insulating substrate may be made of the same material. Thus, processes for forming the protective layers may be simultaneously performed in one process so that the processes can be simplified.

A method of manufacturing the embedded printed circuit board according to one embodiment of the present application will be hereinafter described with reference to FIGS. 1 to 11.

Figure 1:
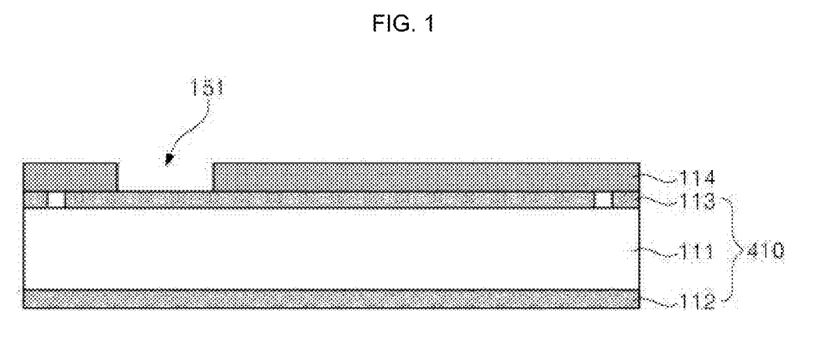
FIGS. 1 to 11 are views illustrated for explaining an embedded printed circuit board and a method of manufacturing the embedded printed circuit board according to one embodiment of the present application.

As illustrated in FIG. 1, a carrier board 410 in which copper foil layers 112, 113 are formed on one surface and another surface of a substrate 111 is prepared, and a circuit is formed at the copper foil layer 113 on the one surface of the substrate 111.

Also, the adhesive layer 114 is formed on the carrier board 410, and an opening 151 is formed by a $CO_2$ laser, a YAG laser, a drill or a mold punching method.

At this time, the adhesive layer 114 may be formed with one film, and a thickness of the adhesive layer 114 may range from 25 to 50 μm. As such, when the adhesive layer 114 is formed with one film, the adhesive layer 114 may be uniformly formed, and the production process may be easily performed.

Meanwhile, a thickness of the adhesive layer 114 may range from 25 to 50 μm. When the thickness of the adhesive layer 114 is less than 25 μm, it is difficult to secure insulating resistance for protecting the sensor element 115. When the thickness of the adhesive layer 114 is more than 50 μm, it is problematic in that a thickness of the embedded printed circuit board is unnecessarily increased, despite the fact that insulating resistance for protection of the sensor element 115 is not additionally secured.

Accordingly, according to one embodiment of the present application, the adhesive layer 114 is formed to have a thickness of 25 to 50 μm so that insulating resistance for protecting the sensor element 115 can be secured.

Figure 2:
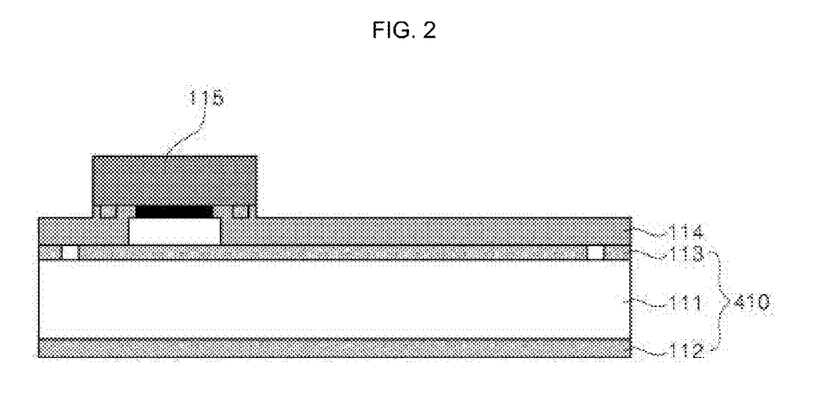

Then, as illustrated in FIG. 2, the first element 115 is mounted on the adhesive layer 114 of the carrier board 410.

At this time, the first element 115 may be any one of an infrared ray sensor, a proximity sensor, a temperature sensor, a humidity sensor, a gas sensor, an image sensor, an RGB sensor, and a gesture sensor.

Figure 3:
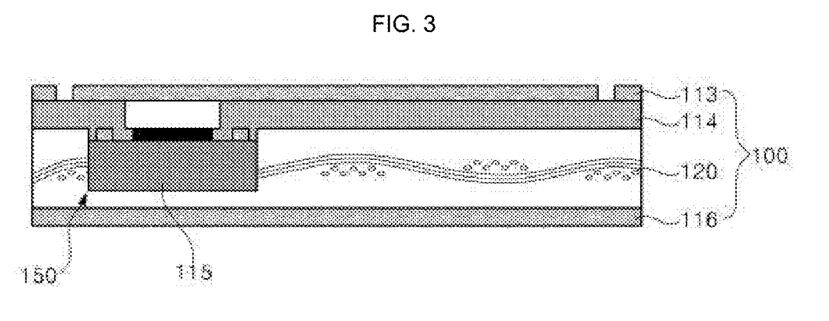

Then, as illustrated in FIG. 3, the embedded printed circuit board is formed by leaving the copper foil layer 113, the adhesive layer 114, and the first element 115 of the carrier board 410 on the first insulating substrate 120, and by removing the substrate 111 and the copper foil layer 112 corresponding to the remaining layers of the carrier board 410

More specifically, as illustrated in FIG. 3, the embedded printed circuit may be configured such that the first cavity 150 is formed in the first insulating substrate 120, the first element 115 is mounted in the first cavity 150, and a conductive layer 116 is further included At this time, the first insulating substrate 120 may be formed by including a resin material in a glass fiber.

Figure 4:
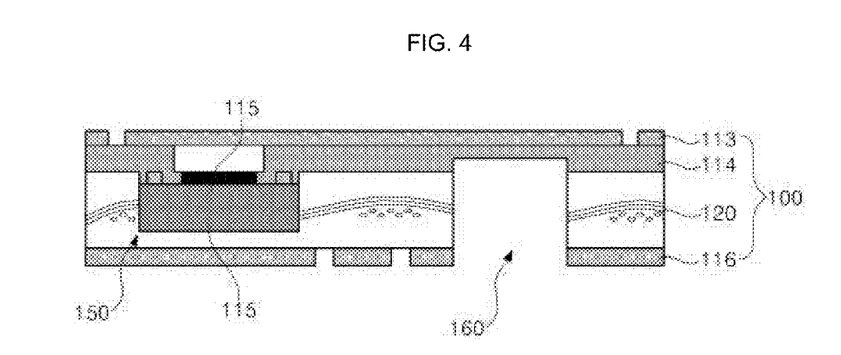

Then, as illustrated in FIG. 4, a first laminate part 100 is completed by patterning the conductive layer 116 and by further forming the second cavity 160. At this time, the second cavity may be formed using a drill.

The second cavity 160 formed as described above is a space in which an element are disposed. When the embedded printed circuit board has no defect as a tested acceptable product, the element may be disposed in the second cavity 160.

Figure 5:
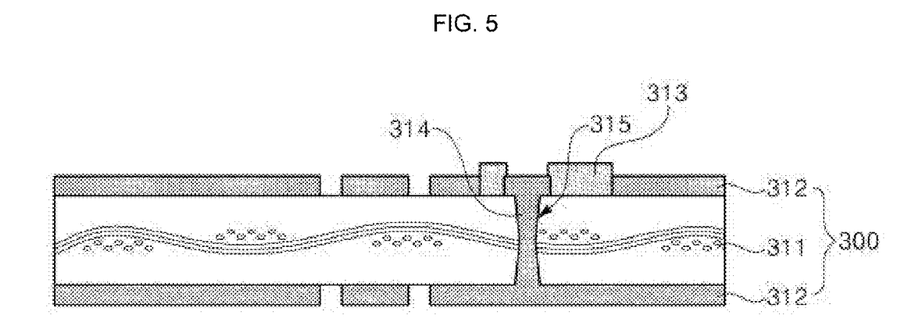

After this, as illustrated in FIG. 5, a via 315 is formed in the second insulating substrate 311 using a laser drill, a plated via 314 and a conductive layer 312 are formed by performing plating and patterning. Then, a protective layer 313 is formed, and a second laminate part 300 is formed by performing surface treatment.

Figure 6:
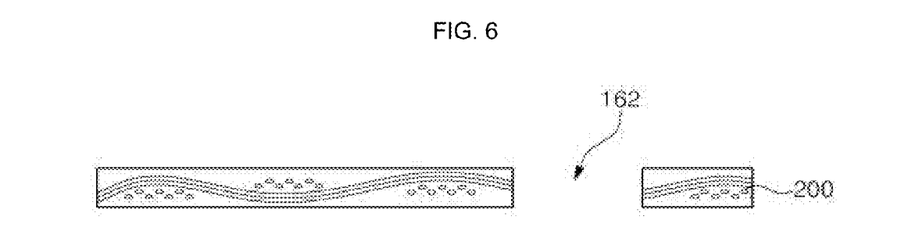

Then, as illustrated in FIG. 6, a bonding layer 200 for bonding the first laminate part 100 to the second laminate part 300 may be formed. At this time, the bonding layer 200 may include an opening 162.

Figure 7:
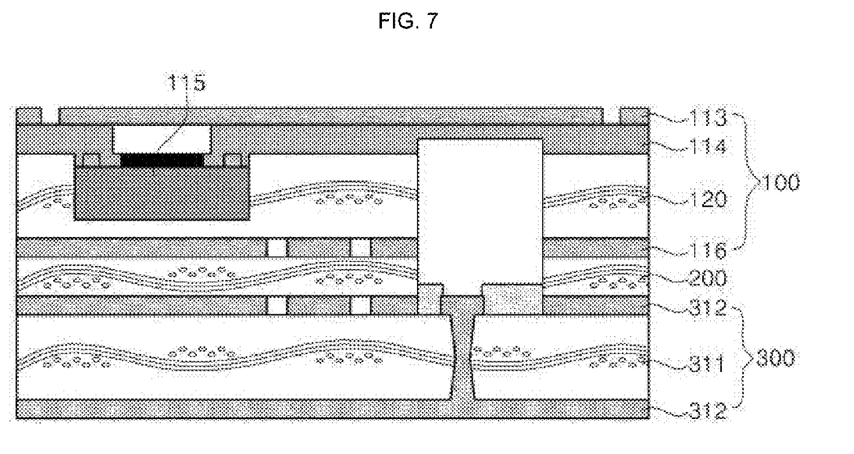

Then, as illustrated in FIG. 7, the first laminate part 100, the bonding layer 200 and the second laminate part 300 are sequentially laminated.

Figure 8:
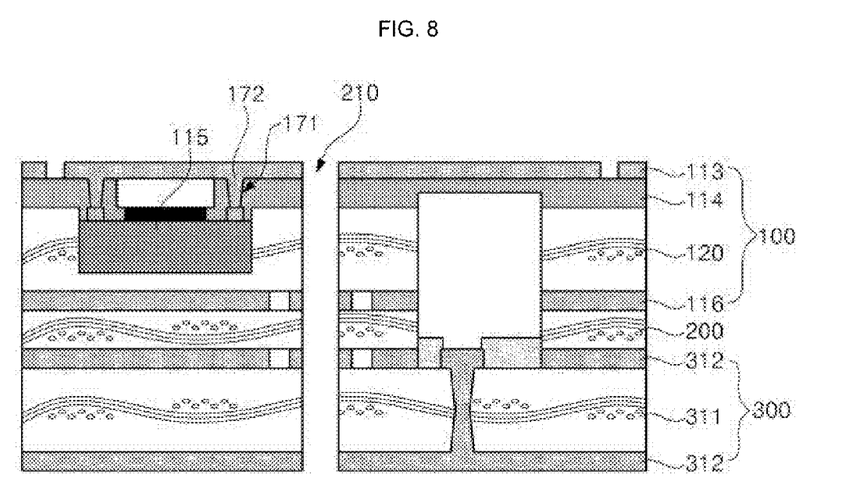
Figure 9:
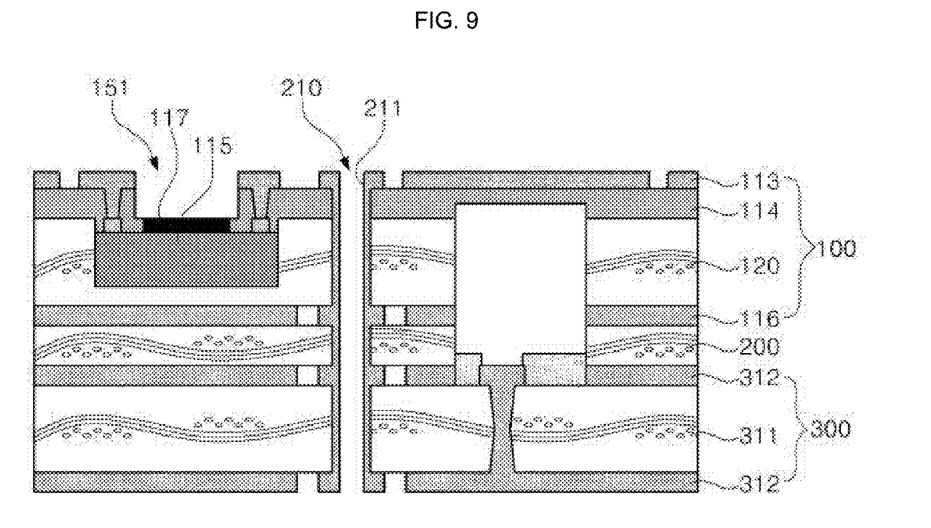

Then, as illustrated in FIG. 8, the through hole 210 and the via 171 are formed, and a plated via 172 is formed by performing plating. As illustrated in FIG. 9, the conductive circuit 211 is formed.

At this time, the through hole 210 and the via 171 may be formed by performing processing using a laser.

Figure 10:
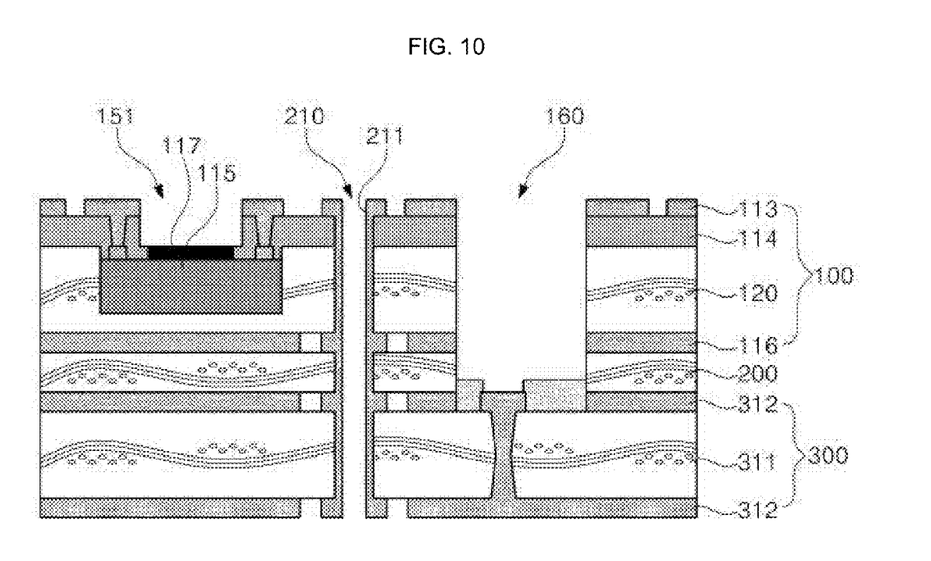

Also, as illustrated in FIG. 10, the second cavity 160 is formed by removing a part of each of a copper foil layer 113 and the adhesive layer 114. At this time, the second cavity 160 may be formed by performing processing using a laser.

Then, as illustrated in FIG. 11, the protective layer 170 may be further formed on both surfaces of the embedded printed circuit board.

A structure of the embedded printed circuit board according to one embodiment of the present application will be hereinafter described with reference to FIG. 11.

As illustrated in FIG. 11, the embedded printed circuit board includes the first insulating substrate 120, the first element 115, the adhesive layer 114 and the second insulating substrate 311.

More specifically, the embedded printed circuit board according to one embodiment of the present application may include the first laminate part 100, the bonding layer 200, and the second laminate part 300. The first laminate part 100 may include the first insulating substrate 120, the first element 115, the adhesive layer 114, and the copper foil layer 113. The second laminate part 300 may include the second insulating substrate 311 and the conductive layer 321.

The first insulating substrate 120 includes a plurality of cavities 150, 160.

The first element 115 is disposed in the first cavity 150 of the plurality of cavities 150, 160.

The adhesive layer 114 is attached to the first insulating substrate 120 and the first element 115.

Also, the adhesive layer 114 may include the opening 151 to which the sensing part 117 of the sensor element 115 is exposed, and the adhesive layer 114 may cover an upper portion of the first element 115 and the first insulating substrate 120.

At this time, a part of the bonding layer 114 may be formed on the first element 115.

Also, the adhesive layer 114 may be formed with one film and a thickness of the adhesive layer 114 may range from 25 to 50 μm. When the adhesive layer 114 is formed with one film, the adhesive layer 114 may be uniformly formed, and a production process may be also simplified.

Meanwhile, a thickness of the adhesive layer 114 may range 25 to 50 μm. When the thickness of the adhesive layer 114 is less than 25 μm, it may be difficult to secure insulating resistance for protecting the sensor element 115. When the thickness of the adhesive layer is more than 50 μm, it is problematic in that a thickness of the printed circuit board is unnecessarily increased, despite the fact that it is difficult to additionally secure insulating resistance for protecting the sensor element 115.

Accordingly, according to one embodiment of the present application, the bonding layer 114 is formed to have a thickness of 25 to 50 μm so that insulating resistance for protecting the sensor element 115 can be secured.

Also, the second cavity 160 is formed in the first laminate part 100.

That is, the second cavity 160 is formed in the first insulating substrate 120 included in the first laminate part 100, and the second insulating substrate 311 included in the second laminate part 300 forms a bottom surface of the second cavity 160.

Also, the bonding layer 200 for bonding the first insulating substrate 120 of the first laminate part to the second insulating substrate 311 of the second laminate part 300 may be further included. The bonding layer 200 may include the opening 162, wherein the opening 162 may form the second cavity 160.

The bonding layer 200 bonds the first laminate part 100 to the second laminate part 300. More specifically, the bonding layer may bond the first insulating substrate 120 to the second insulating substrate 311.

The embedded printed circuit board configured as described above may further include the protective layer 170 on both surfaces thereof.

The second cavity 160 is a space in which an element is disposed. When the embedded printed circuit board configured as described above is a tested acceptable product having no defect, the element may be disposed in the second cavity 160.

Accordingly, when the conventional embedded printed circuit board has a defect, it is problematic in that the conventional embedded printed circuit board should be discarded with the high-priced elements, but according to the present embodiment of the invention, high-prices elements are not mounted to the embedded printed circuit board during a production process, and thereafter, the elements are mounted to merely the embedded printed circuit board corresponding to a tested acceptable product so that a production yield rate can be improved and a production cost can be reduced.

Furthermore, according to the embodiment of the present application, the plurality of elements may be disposed in an embedded type, and a more suitable embedding method may be provided according to the kind and price of various elements.

As set forth above, according to some embodiments of the present application, high-prices elements are not mounted to the embedded printed circuit board during a production process, and thereafter, the elements are mounted to merely the embedded printed circuit board corresponding to a tested acceptable product so that a production yield rate can be improved and a production cost can be reduced. Accordingly, a problem that high-priced embedded elements should be discarded with a conventional embedded circuit board when the conventional embedded circuit board has a defect can be solved.

Also, according to some embodiments of the present application, a plurality of elements can be disposed in an embedding type, and a more suitable embedding method may be provided according to the kind and price of various elements.

An aspect of embodiments of the present application provides an embedded printed circuit board capable of improving a production yield rate and reducing a production cost by installing high-priced elements merely on an embedded printed circuit board corresponding to a completed normal product without installing the high-priced elements on the embedded printed circuit board during a production process.

Another aspect of embodiments of the present application provides a suitable embedding method according to the kind of price of various elements so that a plurality of elements can be disposed in an embedding form.

According to an aspect of embodiments of the present application, an embedded printed circuit board may include: a first insulating substrate including a first cavity in which a first element is mounted; a second cavity separated from the first cavity and formed to pass through the first insulating substrate; and a second insulating substrate forming a bottom surface of the second cavity.

In particular, in such a case, the second cavity may have a top surface that faces the bottom surface and is open and may be formed to have a larger depth than a depth of the first cavity.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present application and is not to be construed as limited to the specific embodiments disclosed, and that modifications to the disclosed embodiments, as well as other embodiments, are intended to be included within the scope of the appended claims and their equivalents.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An embedded printed circuit board, comprising:
a first insulating substrate including a first cavity in which a first element is mounted;
a second cavity separated from the first cavity and formed to pass through the first insulating substrate;
an adhesive layer disposed on the first insulating substrate to cover a part of the first cavity and a part of an upper portion of the first element; and
a second insulating substrate formed on a bottom surface of the second cavity.

2. The embedded printed circuit board of claim 1, wherein the second cavity has a top surface that faces the bottom surface and is open, and also has a larger depth than a depth of the first cavity.

3. The embedded printed circuit board of claim 2, wherein the depth of the first cavity is less than a thickness of the first insulating substrate.

4. The embedded printed circuit board of claim 3, wherein a thickness first element is less than the thickness of the first insulating substrate.

5. The embedded printed circuit board of claim 2, further comprising a conductive pattern exposed to the bottom surface of the second cavity.

6. The embedded printed circuit board of claim 2, further comprising a bonding layer between the first insulating substrate and the second insulating substrate.

7. The embedded printed circuit board of claim 6, wherein the second cavity is structurally formed to pass through the bonding layer.

8. The embedded printed circuit board of claim 6, wherein a thermal expansion coefficient of the bonding layer is substantially identical to that of the first insulating substrate.

9. The embedded printed circuit board of claim 6, wherein at least one conductive layer is exposed to an internal side wall of the second cavity.

10. The embedded printed circuit board of claim 9, further comprising a protective layer formed on the bottom surface of the second cavity to be adjacent to the exposed conductive layer.

11. The embedded printed circuit board of claim 10, wherein a thickness of the protective layer is more than that of the conductive layer.

12. The embedded printed circuit board of claim 1, wherein the adhesive layer adheres the first insulating substrate to the first element, and includes an opening to which the first element is exposed.

13. The embedded printed circuit board of claim 1, wherein a thickness of the adhesive layer ranges from 25 to 50 μm.

14. The embedded printed circuit board of claim 12, wherein the opening exposes a sensing part of the first element.

15. The embedded printed circuit board of claim 12, wherein the first element is any one of an infrared ray sensor, a proximity sensor, a temperature sensor, a humidity sensor, a gas sensor, an image sensor, an RGB sensor, and a gesture sensor.

16. The embedded printed circuit board of claim 14, wherein the opening to which the sensing part is exposed has a gas staying space part having a predetermined depth.

17. The embedded printed circuit board of claim 1, further a through hole and a conductive circuit, wherein the through hole passes through the first insulating substrate and the second insulating substrate.

18. The embedded printed circuit board of claim 17, further comprising a protective layer on an external surface of the second insulating substrate and the first insulating substrate.

19. The embedded printed circuit board of claim 18, wherein the protective layer of the bottom surface of the second and the protective layer of the external surface of the second insulating substrate are made of the same material.

* * * * *